United States Patent [19]
del Puerto et al.

[11] Patent Number: 5,088,006
[45] Date of Patent: Feb. 11, 1992

[54] LIQUID FILM INTERFACE COOLING SYSTEM FOR SEMICONDUCTOR WAFER PROCESSING

[75] Inventors: Santiago E. del Puerto, Milton; Paul M. Gaschke, Pleasantville, both of N.Y.

[73] Assignee: International Business Machines Corporation, Armonk, N.Y.

[21] Appl. No.: 691,628

[22] Filed: Apr. 25, 1991

[51] Int. Cl.$^5$ .............................................. H05K 7/20
[52] U.S. Cl. ................................... 361/385; 361/380; 361/382; 357/82
[58] Field of Search .................. 174/15.1, 16.1; 165/80.3, 80.4, 104.32, 104.33; 357/79, 82; 361/382, 380, 385, 386, 389

[56] References Cited

U.S. PATENT DOCUMENTS

| | | | |
|---|---|---|---|
| 4,019,098 | 4/1977 | McCready et al. | 361/385 |
| 4,559,580 | 12/1985 | Lutfy | 361/385 |
| 4,750,086 | 6/1988 | Mittal | 361/382 |
| 4,897,762 | 1/1990 | Daikoku | 361/382 |
| 4,918,928 | 4/1990 | Morioka | 62/51.1 |
| 4,920,574 | 4/1990 | Yammamoto | 361/385 |
| 4,942,497 | 7/1990 | Mine | 361/385 |
| 4,956,746 | 9/1990 | Gates, Jr. et al. | 361/385 |
| 4,967,832 | 11/1990 | Porter | 165/104 |
| 4,969,168 | 11/1990 | Sakamoto | 378/34 |

OTHER PUBLICATIONS

IBM Technical Disclosure Bulletin, Antonetti et al., "Liquid Cooling Distribution Circuit With Bypass Reservoir", vol. 23, No. 3, 1/81, pp. 3806-3807.

Primary Examiner—Gregory D. Thompson
Attorney, Agent, or Firm—Richard A. Romanchik

[57] ABSTRACT

A semiconductor wafer, liquid interface clamping and cooling system 80 includes a chuck 10 having clamping section 12 with a top surface 16 with three clamping-/cooling circuit grooves machined therein for providing a liquid interface between a wafer under test and the top surface 16. A bottom surface 64 of the clamping section has a double spiral cooling circuit machined therein for providing backside cooling. A source vessel 110 maintained at atmospheric pressure provides fluid to the top surface clamping/cooling circuits and a collection vessel 112 maintained at house vacuum pressure collects the fluid. A set of processor controlled valves 114, 118, 128, 130, 132, 141, 142 144, 158 and 164 control the fluid in a preprogrammed sequence. A chiller system 82 and pump 90 provide temperature regulated fluid flow to the clamping section 12 bottom surface 64.

12 Claims, 6 Drawing Sheets

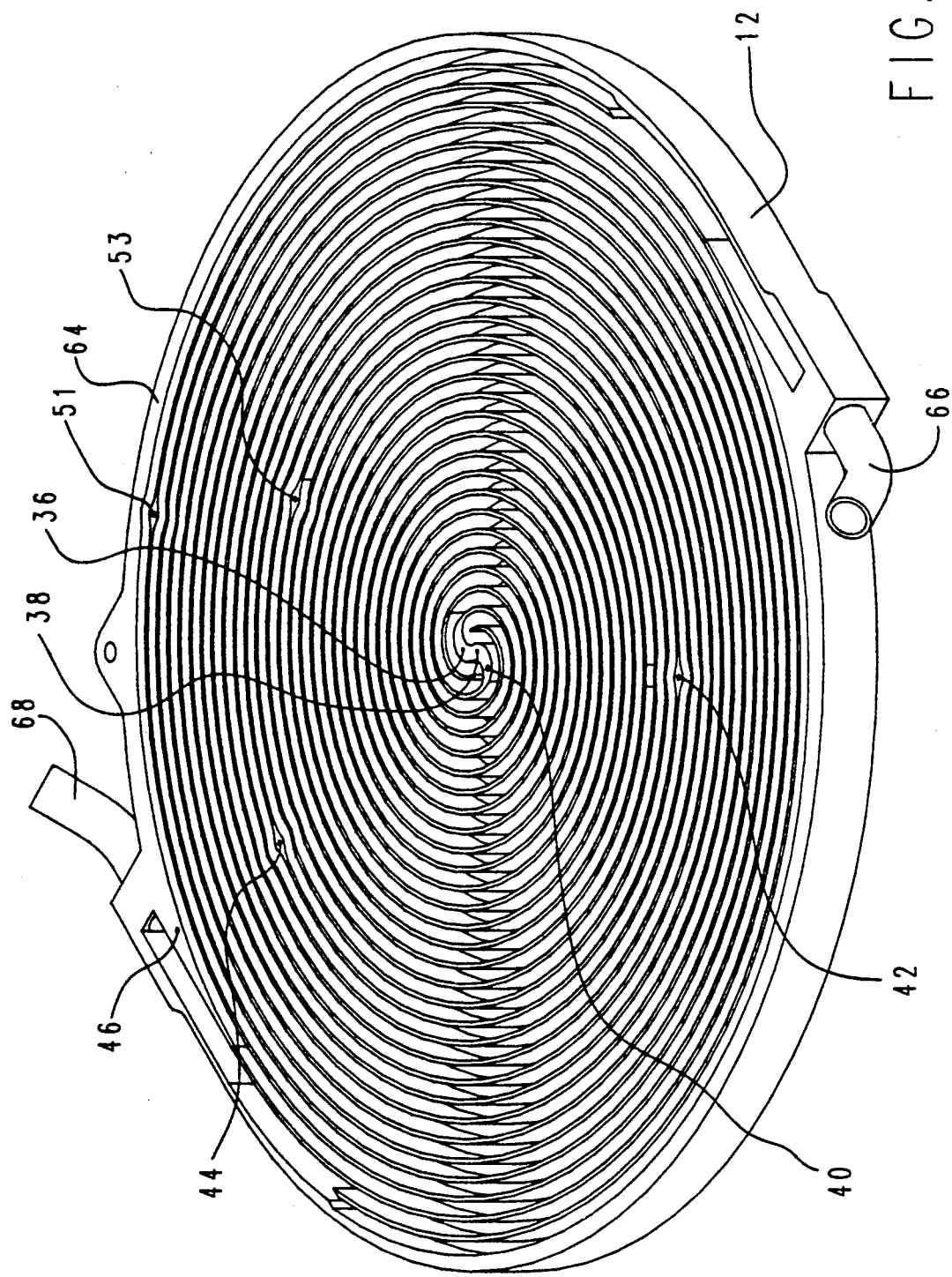

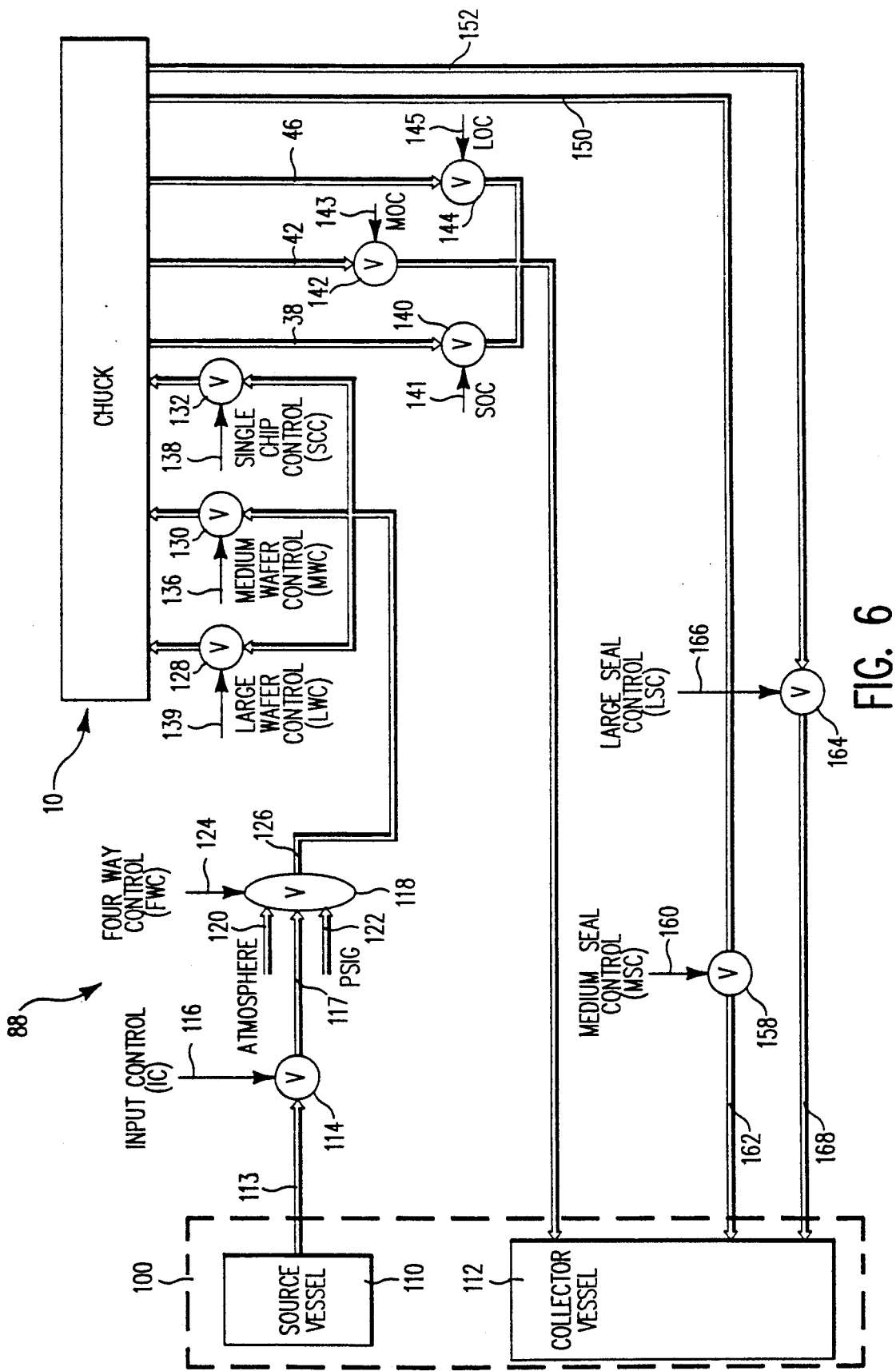

LIQUID FILM INTERFACE COOLING SYSTEM FOR SEMICONDUCTOR WAFER PROCESSING

TECHNICAL FIELD

The present invention relates to semiconductor wafer processing and more particularly, a liquid film interface clamping and cooling system for semiconductor wafer processing.

CROSS-REFERENCE

This Patent Application is related to U.S. patent Application Ser. No. 071,691,655, entitled, "Liquid Film Interface Cooling Chuck for Semiconductor Wafer Processing", which was filed concurrently on Apr. 25, 1991, and which is assigned to the same assignee as this Patent Application, and the disclosure of which is incorporated herein by reference.

BACKGROUND ART

The high cost associated with manufacturing integrated circuits dictates that defective devices be diagnosed and dealt with as early as possible in the manufacturing line. For this reason, it is highly advantageous to test integrated circuits at the wafer level before further processing and packaging. Circuits are tested on wafers by first clamping the wafer to a chuck and then placing highly sophisticated probes in contact with the circuit devices. These probes must utilize pressure in order to make adequate electrical contact to test the devices, and therefore may apply forces up to 100 psi onto the wafer. Once probe contact is made, the circuits are tested for both functionality and power integrity. Large scale integrated circuits may have to be tested at power levels in excess of 100 watts, which consequently generates a tremendous amount of heat build-up in the chips.

The chucks which clamp wafers during the aforementioned testing process must provide structural support for the wafer in order to withstand the pressure from the test probe, hold the wafer in place, achieve and maintain specified chuck temperatures, and provide heat sinking capability to maintain the wafer within the thermal specifications.

A popular way of cooling ICs for testing in the prior art was to dice the wafer up into single chips, mount the chips onto substrates and then test the chip while utilizing a variety of methods to conduct heat away from the substrate to which the chip was mounted. Applications for this type of approach can be found in U.S. Pat. Nos. 4,920,574 (Yammamoto, et al.), 4,897,762 (Daikoku, et al.) and 4,942,497 (Mine, et al.). The techniques disclosed in these patents are unfavorable, though, because they require processing beyond the wafer stage of the manufacturing process before testing can begin.

Another technique utilized to cool integrated circuits during manufacturing test is to spray a high volume of liquid against the back side of the chip during the testing. Typical systems which utilize this technique are disclosed in U.S. Pat. Nos. 4,750,086 (Mittal); and 4,967,832 (Porter). These systems have also proven to be unfavorable, though, because of the high rate of water which is required for the cooling and also because probe pressures must be kept at an absolute minimum due to the lack of structural support for the wafer.

In another testing environment, vacuum and electrostatic clamping are also utilized to hold wafers to chucks, thereby creating a dry interface between the wafer and chuck. The chuck itself is then cooled in some manner to provide heat transfer from a chip through the chuck. The dry film interface in these systems represents a high thermal resistivity which severely limits the amount of testing which can be performed to the wafer due to the fact that high power chips produce high localized heat build-up on the wafer itself. In some of these dry interface system, a dry gas such as helium is injected between the wafer and the chuck to help provide a better heat conductor. It is difficult, however, to reduce the thermal resistance of these dry interface chucks below 1.1° C./watt thermal resistivities.

A clamping and cooling system for high power integrated circuit test at the wafer level which overcomes the above mentioned deficiencies is, therefore, highly desirable.

DISCLOSURE OF THE INVENTION

The object of the present invention is to provide a system for clamping a semiconductor wafer that provides adequate clamping, support, and temperature control and stability for circuit test at the wafer level.

Another object of the present invention is to provide for a universal clamping system which can be utilized for multiple wafer sizes and test circuit environments.

Yet another object of the present invention is to provide for an automated clamping system which minimizes contact between operator and equipment.

According to the present invention, a liquid film interface chuck assembly includes a two piece chuck, having a clamping section and support section, which are connected to a cooling liquid control system. The clamping section of the chuck has two surfaces: a top surface which has shallow spiral groove circuits machined therein for providing a liquid interface between the top of the chuck and the wafer; and, a bottom surface having a parallel double Archimedian spiral machined therein for circulating a cooling liquid. The support section of the chuck supports the clamping section and has a flat top for interfacing with the bottom surface of the clamping section and a bottom surface having radially directed ribs machined therein for providing structural support. A chiller/heater system provides temperature regulated liquid through the channels on the bottom surface of the first piece of the chuck. The liquid interface between the chuck and the wafer is maintained by a liquid circulating system which includes a source vessel maintained at atmospheric pressure and a collection vessel maintained at house vacuum pressure for drawing liquid through the wafer/chuck interface.

The present invention drastically decreases the thermal resistance between the wafer and the chuck by wetting the entire backside of the wafer with a uniform liquid. The present invention provides a high clamping force to the wafer which is necessary for probing. The present invention provides the ability to constantly circulate and replenish the liquid film, thus preventing it from heating up and evaporating. The liquid film is held exclusively to the back surface of the wafer during test, thus preventing it from leaking to the front side of the wafer or to adjacent product and equipment. The present invention facilitates quick and effective removal of the film once the testing has been completed in order to prevent the liquid from migrating to the front surface of the wafer or to adjacent product equipment. The present invention provides the ability to supply positive pressure between the wafer and the chuck after the test cycle in order to overcome the tendency of wafers to stick to chucks. The present invention is light weight and easily meets wafer stepper weight requirements. In addition, it is possible to circulate and control the flow and temperature of the coolant and the interface liquid of the present invention through a pre-programmed cycle in an automatic function, to thereby minimize operator interaction.

These and other objects, features and advantages of the present invention will become more apparent in light of the detailed description of exemplary embodiments thereof, as illustrated by the drawings.

BRIEF DESCRIPTION OF THE DRAWINGS

FIG. 3 is a bottom isometric view of the clamping section of the chuck utilized with the clamping/cooling system of the present invention.

FIG. 6 is a simplified schematic block diagram of the clamping/cooling system of the present invention.

BEST MODE FOR CARRYING OUT THE INVENTION

Figure 1:
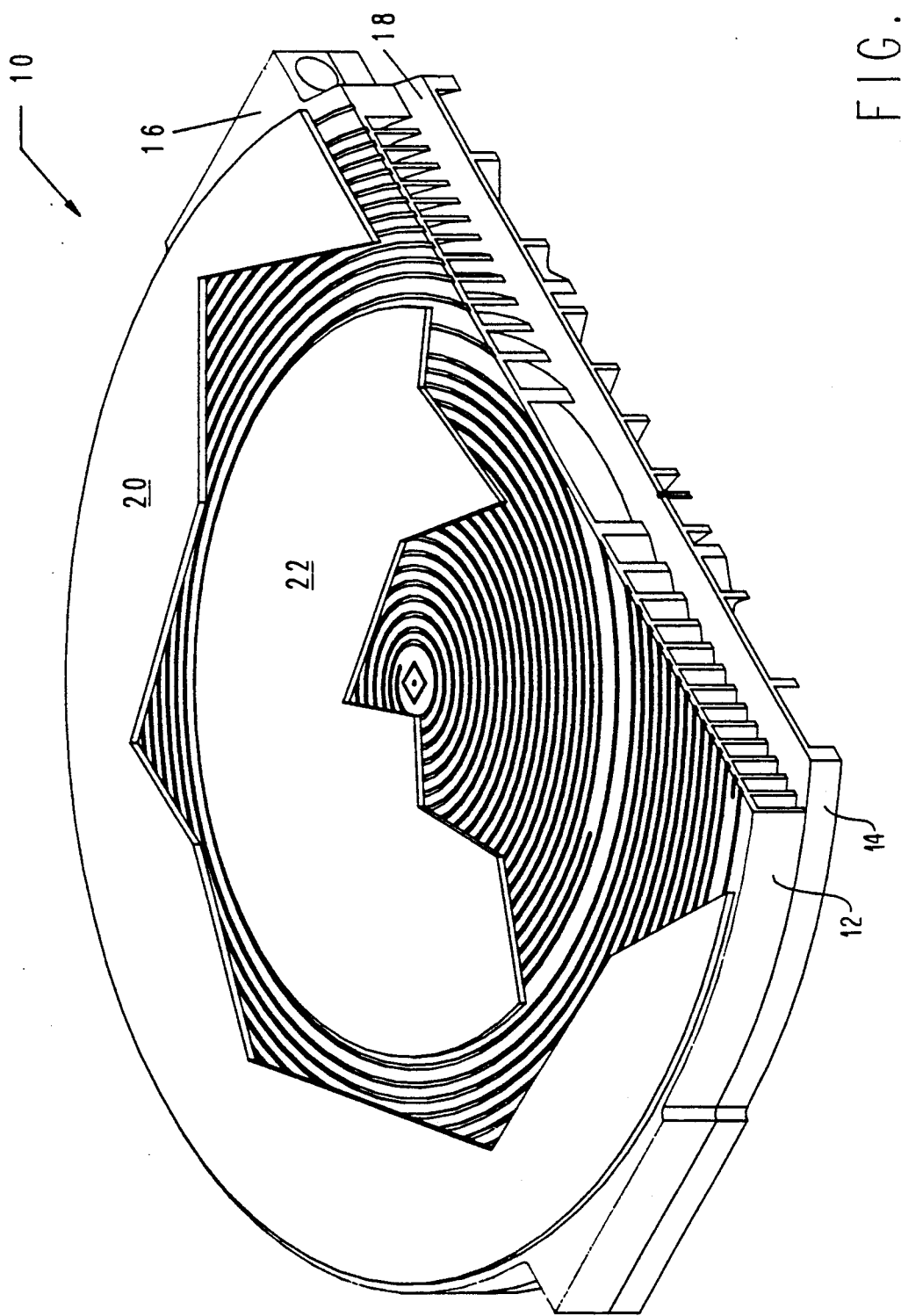
FIG. 1 is a cross sectional, isometric view of the chuck utilized with the clamping/cooling system of the present invention for clamping different size wafers, which are shown partly cut away.

Referring now to FIG. 1, the chuck assembly 10 of the present invention includes a clamping section 12 and a support section 14. The top surface 16 of the clamping section 12 is designed to support three different size semiconductor wafers and/or chips. Large size wafers 20, medium sized wafers 22 and single chips (not shown) can be clamped by the present invention.

Both the clamping section 12 and the support section 14 are machined copper plates. The top surface 18 of the support section 14 is plated with a tin/lead composition, such as 90/10 to 95/05. The two sections 12, 14 are thereby soldered together by clamping the two pieces together and heating them to an appropriate temperature, such as 315 degrees C.

The top surface 16 of the clamping section 12 has several sets of grooves and vias machined therein as will be described in greater detail hereinafter. The bottom surface of clamping section 12 has cooling channels machined therein. These cooling channels will also be described in greater detail hereinafter.

The top surface of support section 18 is flat for sealing the cooling channels of the clamping section 12 and the bottom surface of support section 14 has radial ribbing machined into it. The purpose of the support section 14 ribbing is to reduce the weight of the chuck 10 without sacrificing structural integrity.

Figure 2:
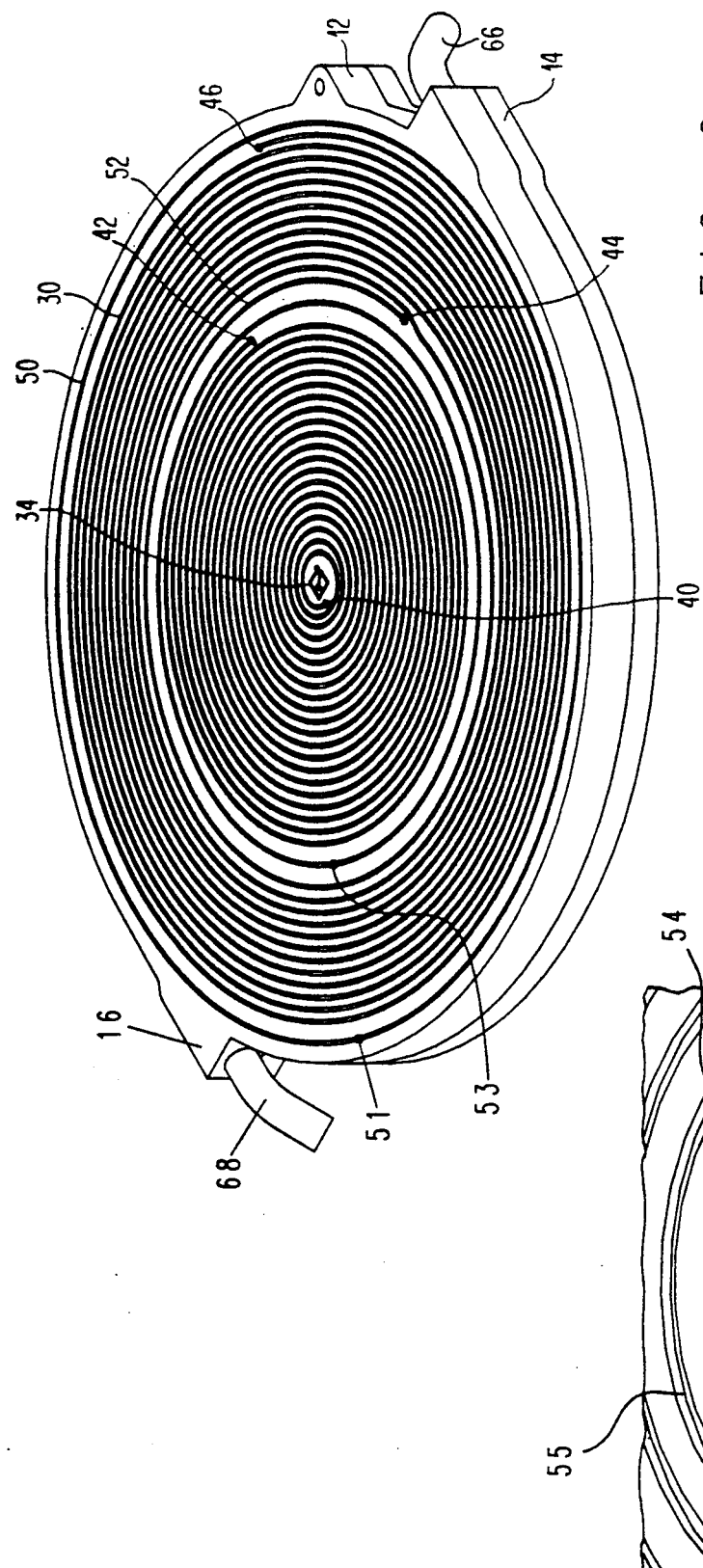
FIG. 2 is a top isometric view of the clamping section of the chuck utilized with the clamping/cooling system of the present invention.

Referring now to FIG. 2, the top surface 16 of clamping section 12 has at least three independent liquid interface cooling circuits machined therein in order to accommodate at least two different sizes of semiconductor wafers plus a single semiconductor chip. These three circuits comprise an outer circuit 30, a middle circuit 32, and an inner circuit 34. The number of cooling circuits is variable and dependent on the intended use of the chuck.

Figure 2A:
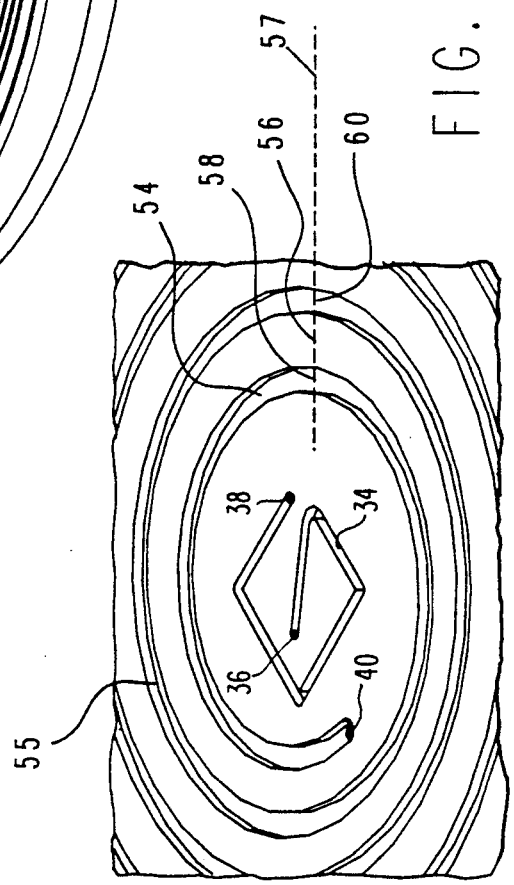
FIG. 2A is an exploded, top isometric view of the inner cooling circuits of the clamping section of the chuck utilized with the clamping/cooling system of the present invention.

Referring now to FIG. 2A, an exploded view of the center of the top side 16 of clamping section 12 illustrates the inner most cooling circuit 34.

Referring now to FIG. 2, the outer circuits 30, 32 are spiral in shape while the inner most cooling circuit 34 is square in shape. Liquid is provided to these cooling circuits through input vias 36, 40 and 44 and withdrawn from the circuits through vias 38, 42 and 46, respectively. The vias are machined through both clamping section 12 and support section 14 in order to provide liquid to the cooling circuits 30-34 from the backside of support section 14. The vias 36-46 are located at the innermost end and the outermost end of each cooling circuit. The cooling system of the present invention is designed to have the cooling liquid travel from the inside of each circuit to the outside of each circuit as will be described in greater detail hereinafter.

Sealing grooves 50, 52 are machined into the top surface 16 of clamping section 12, for providing a seal around the outside of wafers when either of the larger cooling circuits 30, 32 is utilized. Vacuum access to these sealing grooves 50, 52 from the bottom of support section 14 is provided by vias 51, 53.

Operation of the clamping and cooling function of the top surface of clamping section 12 for a large wafer (a wafer having a diameter greater than the diameter of sealing groove 50) is as follows. A wafer is placed and centered onto the top surface 16. Once the wafer is in place, house vacuum (about 24 psi below atmosphere) is provided through via 51 to sealing groove 50 to thereby pull the wafer towards the chuck and provide a seal around the outside of the wafer. Liquid is then provided to the innermost vias 36, 40, and 44 of the three cooling circuits. The outermost vias 38, 42, and 46, respectively, are provided with house vacuum. The pressure drop across each of the cooling circuits causes transmission of the fluid from the inner vias to the respective outer vias of each cooling circuit by two ways. The first is that fluid travels along the provided spiral ducts or channels. The second manner in which fluid travels is across the plateaus between the spirals of the ducts through the thin vertical gap created between the wafer and the top surface 16. The force which provides this fluid travel is primarily capillary action created by the close proximity of the wafer to the top surface 16 and the pressure differential between the inner and outer vias 36, 38. This capillary action consequently provides a fluid interface between the wafer and the chuck over most of the top surface 16 of the clamping plate 12.

The relationship between the width of the grooves, the depth of the grooves, the pitch (spacing between the grooves), and the diameter of each spiral of the grooves is critical for creating the aforementioned capillary action. In the present invention it was found that about a 0.03" wide and 0.02"-0.03" deep groove, with about a 0.10" pitch were suitable for creating capillary action and, consequently, providing a uniform liquid film interface between the wafer and the chuck. It is therefore preferable to provide cooling circuits with a depth/width/pitch ratio of about 1/1.2/4. It is also important that the time required for fluid to travel by capillary action from groove to groove be less than the time it takes for fluid to travel along the length of the groove for each concentric spiral. This is in particular most critical at the early stages of fluid transmission, because the diameter of the inner spirals is less than the diameter of the outer spirals.

For example, with reference to FIG. 2A, at the beginning of fluid transmission through the middle cooling circuit 32 (of FIG. 2), fluid will travel up via 40 and along the innermost loop 54. Fluid will also travel by way of capillary action across the interface between the innermost loop 54 and the second loop 55. It is important that fluid travel across this interface, for instance, at point 56 on reference line 57 before the fluid travelling along the groove goes from point 58 in innermost loop 54 to point 60 in the second loop 55. As long as the fluid transmission by capillary action proceeds faster than the fluid transmission along the groove, air pockets between the wafer and chuck will be prevented.

Another critical parameter for proper capillary action is the flatness of the top surface 16 of clamping section 12. Clamping section 12 of the present invention is manufactured from copper and is ground with a 32 microinch RMS finish, although a 32–64 microinch RMS finish is acceptable. The section 12 is then gold plated to provide corrosion protection which ensures good long term thermal contact.

It is to be noted that the fluid transfer on the top surface 16 of clamping section 12 provides two functions. These are: a) mechanically clamping the wafer; and b) cooling the wafer by providing a low thermal resistance interface.

Referring now to FIG. 3, the bottom surface 64 of clamping section 12 has a double Archimedian spiral machined therein for providing back side cooling to the top surface. A standard endmil 3:1 width to depth ratio of grooves is suitable for the backside double spiral. This configuration is preferable because only one tight turn is necessary for the entire circuit, thereby minimizing fluid resistance. The backside cooling fluid is introduced into the circuit through an inlet port 66 and exits through an exit duct 68. Another advantage of the Archimedian double spiral backside cooling circuit configuration of the present invention is that the inlet port 66 and the exit port 68 are located in the same vertical plane. This provides for easier packaging of the chuck assembly 10. The vias 36, 38, 40, 42, 44, 46, 51, 53 for providing fluid to the top surface 16 of the clamping section 12 are machined through selected walls of the double spiral structure.

Figure 4:
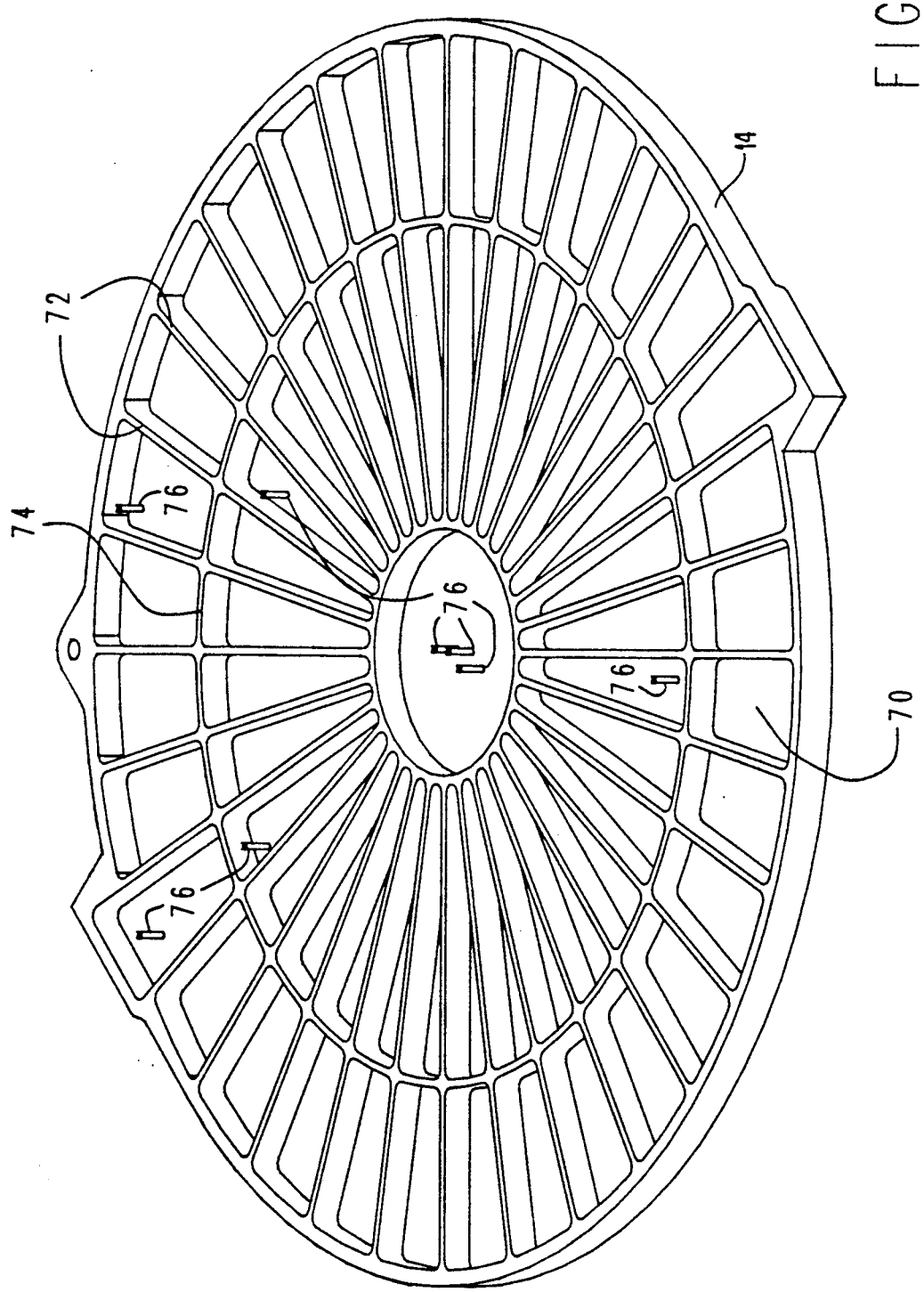
FIG. 4 is a bottom isometric view of the support section of the chuck utilized with the clamping/cooling system of the present invention.
Figure 5:
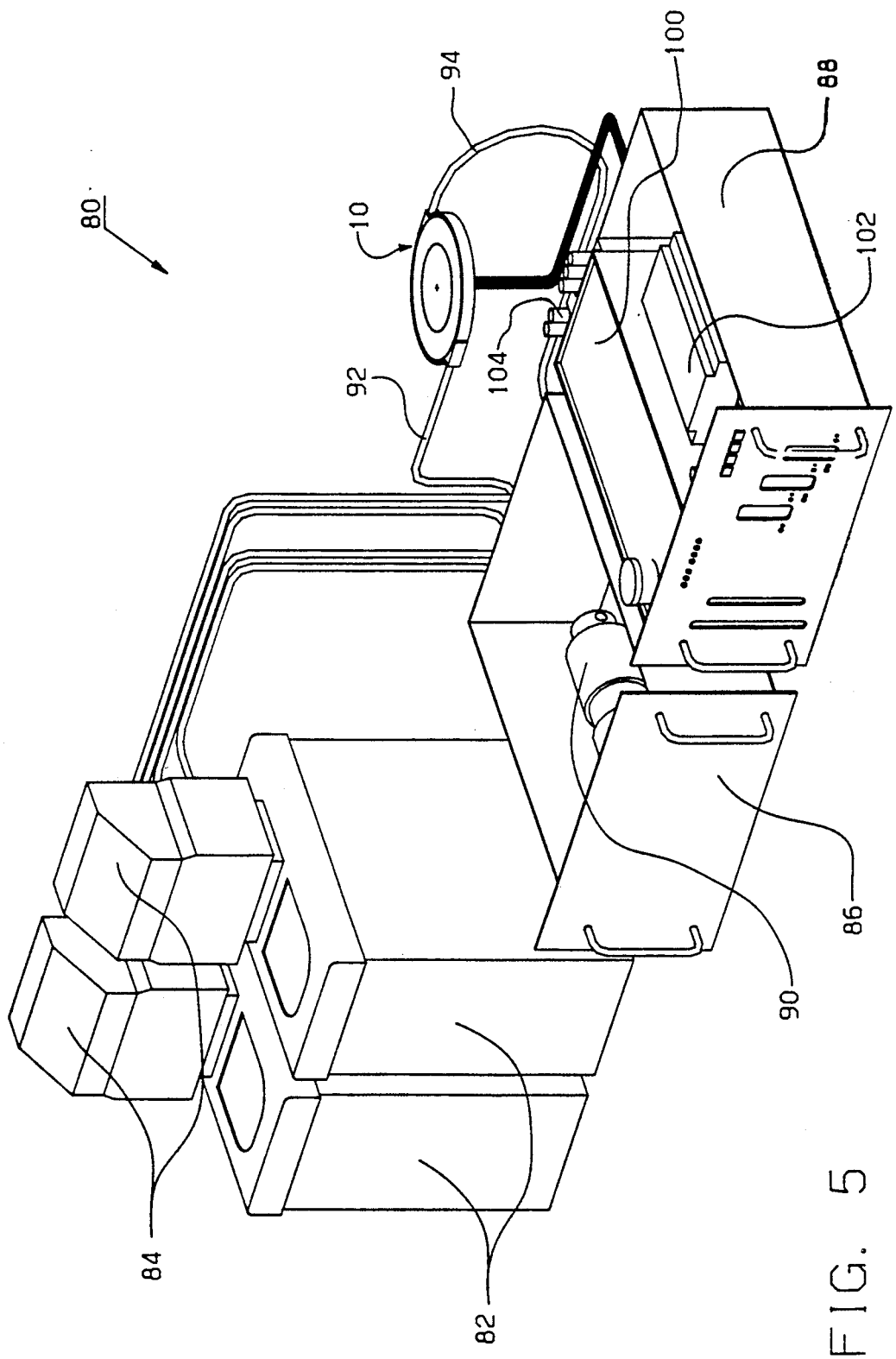
FIG. 5 is a simplified isometric view of the clamping/cooling system of the present invention.

Referring now to FIG. 4, the support section 14 for the chuck assembly 10 has a flat top surface for interfacing with the bottom surface of the clamping section 12 and a ribbed bottom surface 70 for providing structural support to the chuck assembly 10. A plurality of ribs 72 extend radially from the center with an inner ring 74 preventing flexing of the radial ribs. A plurality of via access ports 76 provide a means for transferring fluid through respective vias to and from the top surface 16 of the clamping section 12. The ribbed configuration of the support section 14 minimizes weight, yet provides adequate structural support for the tremendous amounts of pressure applied by test probes.

Prior to installation of the via access ports 76, the support section 14 is plated with a tin/lead composition. The via access ports 76 are installed and the support section 14 is clamped to the clamping section 12. The assembly is then heated to about 315° C., thereby soldering the support section 14 to the clamping section 12.

The system for providing the cooling liquids to the chuck assembly 10 is provided by a cooling control system 80, which is comprised of a pair of water chillers/heaters 82, a pair of temperature control units 84, a circulator controller 86, and an interface controller 88. Although two water chillers/heaters 82 and temperature control units 84 are utilized in the present invention, only one of each might be necessary for a particular application.

The main component of the circulator controller 86 is a circulating pump 90 which pumps cooling liquid through lines 92 and 94 to the back side cooling circuit of clamping section 12. The cooling liquid in the line 92 is connected to the inlet port 66 shown in FIG. 3 the outlet line 94 is connected to the outlet port 68 of FIG. 3. The circulator controller 86 circulates water around a loop from the water chillers 82 to the chuck 10 and back again. This flow of water can be continuous.

The interface controller 88 controls the interface fluid provided to the top surface 16 of the clamping section 12. The main components of the interface controller 88 are a set of collection and source vessels 100, a programmable logic controller (PLC) 102, and a set of control valves 104.

Operation of the cooling liquid control system 80 is as follows. As previously mentioned, the circulator controller 86 continuously circulates water around the double spiral channel of the bottom side of the clamping section of chuck 10 and through the chillers 82. Chillers 82 and the temperature control unit 84 maintain this liquid at a constant temperature. The interface controller 88 is utilized to provide the wafer/chuck interface liquid to the top side of the clamping section of chuck 10.

Referring now to FIG. 6, the interface controller 88 includes a source vessel 110 and a collection vessel 112. Liquid in the source vessel is maintained at atmospheric pressure and the collection vessel is maintained under a partial vacuum at house vacuum pressure which is typically 24 psi below atmospheric pressure. The pressure differential between the source vessel 110 and the collection vessel 112 causes the fluid contained therein to flow through the aforementioned cooling circuits 30, 32, 34. The output fluid from source vessel 110 is provided through a line 113 to an input control valve 114. The opening and closing of input control valve 114 is controlled by an input control (IC) signal provided on a line 116. The output of the input control valve 114 is provided through a line 117 to a four-way control valve 118, which has two other inputs, one being an atmospheric line 120 which is connected to the atmosphere, and the other a pressurized line 122 (labelled PSIG) which is connected to a pressurized source to provide clean compressed air or gas at about 6 PSIG. The four-way control valve is controlled by a four-way control (FWC) signal provided on a line 124. The output of the four-way control valve 118 is provided on a line 126 and is split three ways and provided to a large wafer control valve 128, a medium wafer control valve 130 and a single chip control valve 132. The large wafer control valve is controlled by a large wafer control (LWC) signal provided on a line 134. The medium wafer control valve is controlled by a medium wafer control (MWC) signal provided on a line 136 and the single chip control valve 132 is controlled by a single chip control (SCC) signal provided on a line 138. The output of the single chip control valve 132 is provided to via 36 of the chuck 10 as shown in greater detail in FIG. 2A. The output of the medium wafer control valve 130 is provided to via 40 of chuck 10 and the output of the large wafer control valve 128 is provided to via 44 of chuck 10, all of which are shown in greater detail in FIGS. 2 and 2A. The fluid provided by source vessel 110 and flowing through valves 114, 118, 128, 130 and 132 is circulated on the top surface 16 of the clamping section 12 and output by vias 38, 42 and 46. Output line 38 is connected to a single chip output control valve 140 which is controlled by a single chip output control signal (SOC) provided on a line 141. Output line 42 is connected to a medium wafer output control valve 142 which is controlled by a medium wafer output control signal (MOC) provided on a line 143. Output line 46 is connected to a large wafer output control valve 144 which is controlled by a large wafer output control signal (LOC) provided on a line 145. The outputs of the output control valves 140, 142, 144 are connected to a line 146 which is connected to the collection vessel 112.

Sealing grooves 50, 52 are connected through vias 51, 53 to large seal line 152 and medium seal line 150, respectively. Medium seal line 150 is connected to a medium seal control valve 158, which is controlled by a medium seal control (MSC) signal provided on a line 160. The output of the medium seal control valve 158 is provided to the collection vessel 112 via a line 162. The large seal line 152 is connected to a large seal control valve 164, which is controlled by a large seal control (LSC) signal provided on a line 166. The output of the large seal control valve 164 is provided to the collection vessel 112 via a line 168.

The control signals 116, 124, 134, 136, 138, 146, 160 and 166 are provided by a processor (not shown) which effectuates a pre-programmed cooling sequence to operate the wafer cooling operation.

The operation of the interface controller 88, as effectuated by the processor, for a large wafer (i.e., 200 mm) is as follows. A large wafer is placed on the top surface of chuck 10 and the large seal control valve 164 is opened thereby providing a vacuum to the sealing groove 50 shown in FIG. 2 and sealing outside portion of the wafer. Next, the input control valve 114, the four-way control valve 118, the single chip control valve 132, the medium wafer control valve 130, the large wafer control valve 128, and the three output control valves 140, 142, 144 are all opened. The four-way control valve 118 is opened so as to allow liquid from line 117 to be passed to line 126. Consequently, liquid from source vessel 110 is allowed to flow up through all of the aforementioned cooling circuits 30, 32, 34 onto the chuck, circulate through these circuits and be collected by the collection vessel 112. The result is a liquid interface between the wafer and the top surface 16 of the chuck 10. The wafer is then ready for the test cycle and is tested by an automatic tester (not shown). After testing is completed, the input control valve 114 is closed and the four-way control valve 118 is opened to the atmosphere. This allows most of the liquid between the wafer and the top surface 16 to be sucked into the collection vessel 112. After a predetermined amount of time, (which is enough time to adequately remove most of the liquid under the wafer), the output control valves 140, 142, 144 and the large seal control valve 164 are closed. The four-way control valve 118 is then opened to the PSIG source 122 and a positive pressure is provided to the bottom of the wafer to thereby push the wafer off the chuck and allow for easy removal. After removal of the wafer the chuck is ready for placement of another wafer and the cycle is repeated.

The above-mentioned cycle is identical for medium sized wafers (i.e. 125 mm) and single chip devices, with the exception that for medium sized wafers, the large wafer control valve 128 and the large wafer output control valve 144 always remain closed and the medium seal control valve 158 is utilized rather than the large seal control valve 164 for sealing the outer edge of the wafer. For single chip testing, the large wafer control valve 128, the large wafer output control valve 144, the medium wafer control valve 130, the medium wafer output control valve 142, the medium seal control valve 158 and the large seal control valve 164 are always closed.

Flow sensors may be connected in series with various fluid lines, such as 112 and 126 in order to provide real time monitoring of the functioning of the system.

It is to be noted that the use of negative pressure to provide for circulation of the liquid coolant has an inherent safety feature whereby if there is a failure of any component of the liquid cooling system, fluid simply stops flowing through the circuits and is not dispersed outside of the wafer.

In addition, the chuck clamping/cooling system 80 may be run in a "dry" mode wherein no liquid is provided at the wafer/chuck interface. To run the system in this dry mode, the same operating sequence as described hereinbefore is followed, except valve 114 remains closed at all times.

Although the invention has been shown and described with exemplary embodiments thereof, it should be understood by those skilled in the art that the foregoing and various other changes, omissions and additions may be made therein and thereto without departing from the spirit and scope of the invention.

We claim:

1. A cooling system for a substrate comprising:
   a chuck having a top and a bottom, said top having a liquid interface cooling circuit means adapted to provide a liquid interface between said chuck and the substrate, said liquid interface cooling circuit means having an input means and an output means;
   a source vessel connected to said input means for providing a first liquid to said liquid interface cooling circuit means, said source vessel maintaining said first liquid at atmospheric pressure; and,
   a collection vessel connected to said output means for collecting said first liquid, said collection vessel maintaining collected fluid below atmospheric pressure to thereby cause liquid to flow from said source vessel through said liquid interface cooling circuit means and into said collection vessel,
   wherein said liquid interface is adapted to provide both a clamping force to the substrate in order to clamp the substrate to said chuck and a cooling interface in order to cool the substrate.

2. A cooling system for a substrate according to claim 1, further comprising:
   said bottom having a backside cooling circuit means for transferring heat away from said top;
   pump means for pumping a second liquid through said backside cooling circuit means.

3. A cooling system for a substrate according to claim 2, further comprising:
   chiller/heater means for regulating the temperature of said second liquid.

4. A cooling system for a substrate according to claim 1, further comprising:
   first valve means connected between said source vessel and said liquid interface cooling circuit means, for controlling the flow of said first liquid to said liquid interface cooling circuit means.

5. A cooling system for a substrate according to claim 1, further comprising:
   second valve means connected between said liquid interface cooling circuit means and said collection vessel for controlling the flow of said first liquid to said collection vessel.

6. A cooling system for a substrate according to claim 4, further comprising:
   third valve means connected between said first valve means and said liquid interface cooling circuit means, for providing to said first circuit either: a) said first liquid; b) gas at room atmosphere; or, c) pressurized gas.

7. A cooling system for a substrate according to claim 1, further comprising:
   sealing means disposed in said top for providing a vacuum seal around said liquid interface cooling circuit means, and,
   connection means for connecting said sealing means to said collection vessel.

8. A cooling system for a substrate according to claim 7, further comprising:
   fourth valve means connected between said sealing means and said collection vessel for controlling said vacuum seal 9. A cooling system for a substrate comprising:
   a chuck having a top and a bottom, side top having a liquid interface cooling circuit means adapted to provide a liquid interface between said chuck and the substrate, and said liquid interface cooling circuit means having a first input means and a first output means;
   a source vessel connected to said first input means for providing a first liquid to said liquid interface cooling circuit means, said source vessel being maintained at atmospheric pressure;
   a collection vessel connected to said first output means for collecting said first liquid, said collection vessel being maintained below atmospheric pressure to thereby cause liquid to flow from said source vessel through said liquid interface cooling circuit means and into said collection vessel;
   first valve means connected between said source vessel and said liquid interface cooling circuit means, for controlling the flow of said first liquid to said liquid interface cooling circuit means;
   second valve means connected between said liquid interface cooling circuit means and said collection vessel for controlling the flow of said first liquid to said collection vessel;
   third valve means connected between said first valve means and said liquid interface cooling circuit means, for providing either said first liquid, gas at room atmosphere, or pressurized gas to said first circuit;
   sealing means disposed in said top for providing a vacuum seal around said liquid interface cooling circuit means;
   connection means for connecting said sealing means to said collection vessel; and,
   fourth valve means connected between said sealing means and said collection vessel for controlling said vacuum seal,
   wherein said liquid interface is adapted to provide both a clamping force to the substrate in order to clamp the substrate to said chuck and a cooling interface in order to cool the substrate.

10. A cooling system for a substrate according to claim 9, wherein said valve means are responsive to electrical signals, and further comprising:
    processor means responsive to a predetermined programmed control sequence for providing said electrical signals for controlling said valve means.

11. A cooling system for a substrate according to claims 1, 2, 3, 4, 5, 6, 7, or 8, wherein said liquid interface cooling circuit means is comprised of a plurality of liquid interface cooling circuits.

12. A cooling system for a substrate according to claims 9 or 10, wherein said liquid interface cooling circuit means is comprised of a plurality of liquid interface cooling circuits.

* * * * *